United States Patent
Kondo et al.

(10) Patent No.: US 9,858,974 B1
(45) Date of Patent: Jan. 2, 2018

(54) MAGNETIC MEMORY

(71) Applicant: KABUSHIKI KAISHA TOSHIBA, Tokyo (JP)

(72) Inventors: Tsuyoshi Kondo, Kanagawa (JP); Takuya Shimada, Kanagawa (JP); Yasuaki Ootera, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/444,928

(22) Filed: Feb. 28, 2017

(30) Foreign Application Priority Data

Aug. 4, 2016 (JP) ................................ 2016-153859

(51) Int. Cl.
G11C 11/00 (2006.01)
G11C 11/16 (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ......... G11C 11/02; G11C 11/15; G11C 11/16; G11C 11/161; G11C 11/1673;
(Continued)

(56) References Cited

U.S. PATENT DOCUMENTS

| 7,782,663 B2 * | 8/2010 | Kim | ................. | G11B 5/255 365/148 |
| 2008/0205126 A1 * | 8/2008 | Kajiyama | ............... | G11C 11/16 365/158 |

(Continued)

FOREIGN PATENT DOCUMENTS

| JP | 2004-268844 | 10/2004 |
| JP | 5486731 | 5/2014 |
| WO | WO 2009-130738 | 10/2009 |

OTHER PUBLICATIONS

Shunsuke Fukami et al., "Magnetization Switching by Spin-orbit Torque in an Antiferromagnet-Ferromagnet bilayer system", Nature Materials doi :10. 1038/nmat4556. pp. 1-8(2016).
(Continued)

*Primary Examiner* — Tan T. Nguyen
(74) *Attorney, Agent, or Firm* — Finnegan, Henderson, Farabow, Garrett & Dunner, L.L.P.

(57) ABSTRACT

According to embodiments, a magnetic memory includes a structure including a first magnetic layer and a conductive layer, a second magnetic layer, a first electrode electrically connected to a first portion of the structure, a second electrode provided between the first magnetic layer and the second, magnetic layer, a third magnetic layer provided insulatingly from a third portion of the structure, a third electrode electrically connected to a second portion of the structure and a sixth magnetic layer provided between the first electrode and the second electrode is provided. In addition, the magnetic memory includes a first semiconductor layer having a first conductivity type electrically connected to the first electrode, a second semiconductor layer having the first conductivity type electrically connected to the third magnetic layer, and a third semiconductor layer having a second conductivity type electrically connected to the first semiconductor layer and the second semiconductor layer.

20 Claims, 10 Drawing Sheets

(51) Int. Cl.
*H01L 43/02* (2006.01)
*H01L 43/08* (2006.01)
*H01L 27/22* (2006.01)

(52) U.S. Cl.
CPC .......... *H01L 27/224* (2013.01); *H01L 27/228* (2013.01); *H01L 43/02* (2013.01); *H01L 43/08* (2013.01)

(58) Field of Classification Search
CPC ... G11C 11/1675; H01L 43/02; H01L 27/224; H01L 27/228; G01L 43/08
USPC ........ 365/148, 158, 163, 171, 173, 174, 175
See application file for complete search history.

(56) References Cited

U.S. PATENT DOCUMENTS

| | | |
|---|---|---|
| 2011/0069541 A1 | 3/2011 | Ono et al. |
| 2015/0295166 A1 | 10/2015 | Suzuki |

OTHER PUBLICATIONS

Luqiao Liu et al., "Current-induced Switching of Perpendicularly Magnetized Magnetic Layers Using Spin Torque From the Spin Hall Effect", Physical Review Letters 109, pp. 096602-1 to 096602-5, (2012).

Murat Cubukcu et al., "Spin-orbit Torque Magnetization Switching of a Three-terminal Perpendicular Magnetic Tunnel Junction", Applied Physics Letters, vol. 104, 10. 1063/1. 4863407, pp. 042406-1 to 042406-5, (2014).

Zhengyang Zhao et al., "Spin Hall Switching of the Magnetization in Ta/TbFeCo Structures with Bulk Perpendicular Ansiotrophy", Applied Physics Letters 106, 132404, pp. 132404-1 to 132405-4, (2015).

Tsuyoshi Kondo, "Magnetic Memory Device and Magnetic Storage Method", U.S. Appl. No. 15/007,794, filed Jan. 29, 2016.

Tsuyoshi Kondo, "Magnetic Memory and Method for Manufacturing Same"., U.S. Appl. No. 15/260,517, filed Sep. 9, 2016.

\* cited by examiner

MAGNETIC MEMORY

CROSS-REFERENCE TO RELATED APPLICATIONS

This application is based upon and claims the benefit of priority from Japanese Patent Application NO. 2016-153859 filed on Aug. 4, 2016, the entire contents of which are incorporated herein by reference.

FIELD

Embodiments describe herein relate generally to a magnetic memory.

BACKGROUND

Recently a three terminal magnetic random access memory (MRAM; Magnetic Random Access Memory) using torque which is originally caused by spin-orbit interaction has been proposed. In magnetic memories including such MRAM, improvement of the degree of integration (i.e. high integration) has been desired.

DESCRIPTION OF EMBODIMENTS

According to one embodiment, a magnetic memory which includes a structure including a first magnetic layer and a conductive layer, a second magnetic layer, a first electrode electrically connected to a first portion of the structure, a second electrode provided between the first magnetic layer and the second magnetic layer, a third magnetic layer provided insulatingly from a third portion of the structure, a third electrode electrically connected to a second portion of the structure and a sixth magnetic layer provided between the first electrode and the second electrode is provided. In addition, the magnetic memory includes a first semiconductor layer having a first conductivity type electrically connected to the first electrode, a second semiconductor layer having the first conductivity type electrically connected to the third magnetic layer, and a third semiconductor layer having a second conductivity type electrically connected to the first semiconductor layer and the second semiconductor layer.

Hereinafter, respective embodiments of the invention will be described with reference to drawings.

The drawings are schematic and conceptual, and a relation between a thickness and a width of each portion, a size ratio between portions, etc. may not be the same as actual ones. In addition, when the same portion is indicated, a different size or ratio may be indicated depending on the drawings.

In this specification and the respective drawings, the same reference symbol will be assigned to a similar component previously described with regard to a previous drawing, and a detailed description will be appropriately omitted.

First Embodiment

Figure 1:
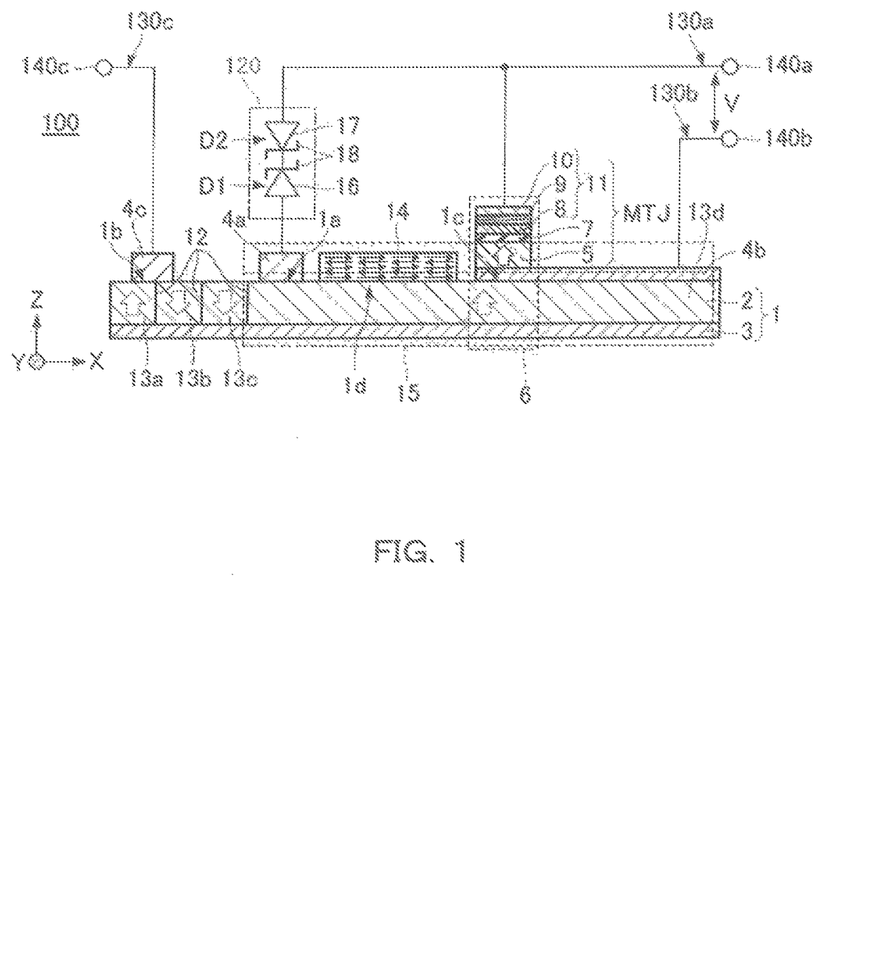
FIG. 1 is a schematic cross-sectional view illustrating a magnetic memory according to a first embodiment.
Figure 2:
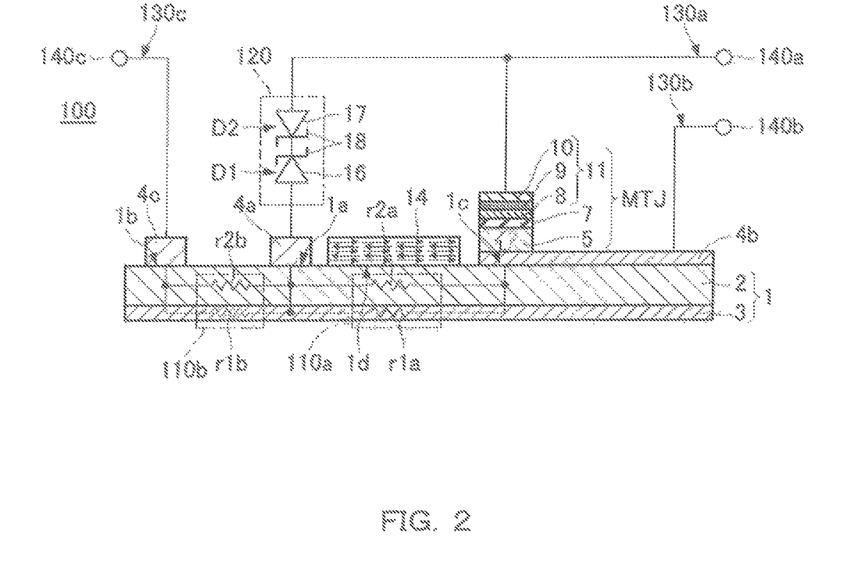
FIG. 2 is a schematic cross-sectional view illustrating the magnetic memory according to the first embodiment.

FIG. 1 and FIG. 2 are schematic cross-sectional views illustrating a magnetic memory according to a first embodiment.

As illustrated in FIG. 1, the magnetic memory 100 according to the first embodiment includes a structure 1. The structure 1 includes a first magnetic layer 2 and a conductive layer 3. A first electrode 4a is provided on a first portion 1a of the structure 1. In an example of FIG. 1, the first portion 1a is on the first magnetic layer 2. However, in the embodiment, the first portion 1a may be on the conductive layer 3 or may be on the first magnetic layer 2 and the conductive layer 3. A second electrode 4b is provided on the first magnetic layer 2 of the structure 1. The second electrode 4b is separated from the first electrode 4a. A third electrode 4c is provided on a second portion 1b of the structure 1. The second portion 1b is separated from the first portion 1a. The second portion 1b may be on the conductive layer 3 or on the first magnetic layer 2 and the conductive layer 3.

A sixth magnetic layer 14 is provided between the first electrode 4a and the second electrode 4b on a fourth portion 1d of the structure 1. The sixth magnetic layer 14 comes into contact with the structure 1. The sixth magnetic layer 14 may come into contact with the conductive layer 3 of the structure 1 or come into contact with the first magnetic layer 2.

The conductive layer 3 is non-magnetic. For example, the conductive layer 3 contains a conductive material whose spin-orbit interaction is large. Examples of such conductive material 3 may include tantalum (Ta) and platinum (Pt).

In this specification, one direction is defined as an X direction. One direction perpendicular to the X direction is defined as a Y direction. A direction orthogonal to the X direction and the Y direction is defined as a Z direction.

For example, the magnetic memory 100 is formed on a semiconductor substrate. For example, a main surface of the semiconductor substrate is defined as an XY plane. In FIG. 1, the semiconductor substrate is omitted and not illustrated.

A second magnetic layer 5 is provided on the second electrode 4b. The first magnetic layer 2 has a third portion 1c at a position separated from the first portion 1a. In this example of FIG. 1, the second magnetic layer 5 is provided above the third portion 1c of the first magnetic layer 2 with the second electrode 4b interposed therebetween. The third portion 1c corresponds to a read head 6 of the magnetic memory 100. An insulating layer (intermediate layer) 7 is provided on the second magnetic layer 5. A third magnetic layer 8 is provided on the insulating layer 7. A coupling layer 9 is provided on the third magnetic layer 8. The coupling layer 9 is non-magnetic. A fourth magnetic layer 10 is provided on the coupling layer 9. The third magnetic layer 8 is antiferromagnetically coupled to the fourth magnetic layer 10 with the non-magnetic coupling layer 9 interposed therebetween. A magnetization direction of the third magnetic layer 8 is opposite to a magnetization direction of the fourth magnetic layer 10. The third magnetic layer 8, the coupling layer 9, and the fourth magnetic layer 10 correspond to a fifth magnetic layer 11 having a synthetic anti-ferromagnetic (Sy-AF) structure. The insulating layer 7 is interposed between the second magnetic layer 5 and the fifth magnetic layer 11 (intermediate layer). The second magnetic layer 5, the insulating layer 7, and the fifth magnetic layer 11 form a magnetic tunnel junction (MTJ). This structure corresponds to an MTJ element. The read head 6 of the magnetic memory 100 includes the MTJ element. In the drawings attached to this specification, a symbol "MTJ" is assigned to the MTJ element.

The fifth magnetic layer 11 is a reference layer. A magnetization direction of the reference layer (fifth magnetic layer 11) is fixed (or pinned). The second magnetic layer 5 is a free layer. A magnetization direction of the free layer (second magnetic layer 5) is variable. The first magnetic layer 2 is a magnetic recording layer. A magnetization direction of the magnetic recording layer (first magnetic layer 2) is variable. The magnetic recording layer (first magnetic layer 2) is magnetostatically coupled to the second magnetic layer 5. In this example of FIG. 1, magnetization directions of the free layer (second magnetic layer 5) and the magnetic recording layer (first magnetic layer 2) correspond to the Z direction. In the embodiment, a magnetization direction may intersect with the Z direction, and is arbitrary. Description will be given of a magnetization direction, conveniently as an "upward direction" or a "downward direction."

The magnetization direction of the magnetic recording layer (first magnetic layer 2) may be changed to either one of an "upward direction" or a "downward direction." For example, a plurality of magnetic domains 13 divided by magnetic domain walls 12 are set in the first magnetic layer 2. The magnetic domain walls 22 are generated in the first magnetic layer 2 so as to traverse the first magnetic layer 2. When the plurality of magnetic domains 13 are set in the first magnetic layer 2, for example, information (data) may be recorded respectively in each of the magnetic domains 13 of the first magnetic layer 2. FIG. 1 illustrates an example in which four magnetic domains 13a, 13b, 13c, and 13d are set in the first magnetic layer 2. In this case, information is recorded in four magnetic domains 13a, 13b, 13c, and 13d of the first magnetic layer 2, respectively. In the example illustrated in FIG. 1, information, a magnetization direction of which corresponds to the "upward direction", is recorded in the magnetic domain 13a and the magnetic domain 13d. Information, a magnetization direction of which corresponds to the "downward direction," is recorded in the magnetic domain 13b and the magnetic domain 13c.

Each information recorded in the magnetic domains 13a to 13d is delivered to the second magnetic layer (free layer) 5 by magnetostatic coupling. A "magnetization direction" of a magnetic domain present below the second magnetic layer 5 is delivered to the second magnetic layer 5. For example, as illustrated in FIG. 1, when a magnetization direction of the magnetic domain 13d present below the second magnetic layer 5 corresponds to the "upward direction", for example, a magnetization direction of the second magnetic layer 5 corresponds to the "upward direction". Alternatively, if a magnetization direction of a magnetic domain 13d present below the second magnetic layer 5 corresponds to the "downward direction," for example, the magnetization direction of the second magnetic layer 5 corresponds to the "downward direction." And for example, when the magnetization direction of the second magnetic layer (free layer) 5 and the magnetization direction of the fifth magnetic layer (reference layer) 11 are parallel to each other, a resistance value of the MTJ element is low. Reversely, for example, when the magnetization direction of the second magnetic layer (free layer) 5 and the magnetization direction of the fifth magnetic layer (reference layer) 11 are antiparallel to each other, a resistance value of the MTJ element is high. The read head 6 reads whether information recorded in the first magnetic layer (magnetic recording layer) 2 corresponds to, for example, "1" or "0" depending on the resistance value of the MTJ element.

As described above, the structure 1 has at least the fourth portion 1d between the first portion 1a and the third portion 1c. In the embodiment, the fourth portion 1d is present on the first magnetic layer 2 side. The sixth magnetic layer 14 is provided in the fourth portion 1d. The fourth portion 1d corresponds to a write head 15 of the magnetic memory 100. The sixth magnetic layer 14 is antiferromagnetic or ferromagnetic. A magnetization direction of the sixth magnetic layer 14 is fixed (or pinned). In the present embodiment, the magnetization direction of the sixth magnetic layer 14 corresponds to the X direction. The sixth magnetic layer 14 comes into contact with the first magnetic layer (magnetic recording layer) 2, and is exchange-coupled thereto. When the sixth magnetic layer 14 is antiferromagnetic, an effect (referred to as an exchange bias) is generated to direct magnetization of the first magnetic layer (magnetic recording layer) 2 in a direction of magnetization along the X direction on a surface of the sixth magnetic layer 14 coming into contact with the first magnetic layer (magnetic recording layer) 2. The same effect is obtained when the sixth magnetic layer 14 is ferromagnetic. However, when the sixth magnetic layer 14 is antiferromagnetic, a disturbance due to an external magnetic field is strong. Thus, the sixth magnetic layer 14 is preferably antiferromagnetic. A magnetic field of the exchange bias is used to invert the magnetization direction of the first magnetic layer 2 to a determined direction when information is written. The sixth magnetic layer 14 determines a direction which is inverted to change a parallel state to an antiparallel state when, for example, a current is allowed to flow from the right to the left along the X direction in the figure in the first magnetic layer (magnetic recording layer) 2.

When a current is allowed to flow in the conductive layer 3, a spin current is generated in the conductive layer 3. When the spin current is generated in the conductive layer 3, spin is injected into the first magnetic layer (magnetic recording layer) 2 from the conductive layer 3. The magnetization direction of the first magnetic layer (magnetic recording layer) 2 is determined depending on whether the spin injected from the conductive layer 3 is "upward" or "downward." A direction of the spin injected from the conductive layer 3 is determined based on a direction of the current flowing in the conductive layer 3. The magnetic memory 100 injects spin into the first magnetic layer (magnetic recording layer) 2 from the conductive layer 3 when information is written. Examples of such a writing scheme include a spin injection scheme.

As illustrated in FIG. 2, the first electrode 4a is connected to the second electrode 4b through a first parallel circuit 110a. The first parallel circuit 110a includes a first resistor portion r1a and a second resistor portion r2a. The first resistor portion r1a corresponds to a resistance component of the conductive layer 3 between the first electrode 4a and the second electrode 4b. The second resistor portion r2a corresponds to a resistance component of the first magnetic layer 2 between the first electrode 4a and the second electrode 4b. A resistance value of the first resistor portion r1a is lower than a resistance value of the second resistor portion r2a.

The third electrode 4c is connected to the first electrode 4a through a second parallel circuit 110b. The second parallel circuit 110b includes a third resistor portion r1b and a fourth resistor portion r2b. The third resistor portion r1b corresponds to a resistance component of the conductive layer 3 between the third electrode 4c and the first electrode 4a. The fourth resistor portion r2b corresponds to a resistance component of the first magnetic layer 2 between the third electrode 4c and the first electrode 4a. A resistance value of the third resistor portion r1b is lower than a resistance value of the fourth resistor portion r2b.

The second electrode 4b is connected to the third electrode 4c through a series circuit of the first parallel circuit 110a and the second parallel circuit 110b.

The magnetic memory 100 includes a circuit element 120. The circuit element 120 includes a first semiconductor layer 16 having a first conductivity type, a second semiconductor layer 17 having the first conductivity type, and a third semiconductor layer 18 having a second conductivity type. The first semiconductor layer 16 is electrically connected to the first electrode 4a. The second semiconductor layer 17 is electrically connected to the fifth magnetic layer 11. In the present embodiment, the second semiconductor layer 17 is electrically connected to the fourth magnetic layer 10 in the fifth magnetic layer 11. The third semiconductor layer 18 is electrically connected to the first semiconductor layer 16 and the second semiconductor layer 18. In the present embodiment, the first semiconductor layer 16 and the second semiconductor layer 17 correspond to a p-type conductivity, and the third semiconductor layer 18 corresponds to an n-type conductivity. The first semiconductor layer 16 and the second semiconductor layer 17 correspond to an anode of a diode. The third semiconductor layer 18 corresponds to a cathode of the diode. The circuit element 120 includes diodes D1 and D2. A cathode of the diode D1 is connected to a cathode of the diode D2. In the present embodiment, the cathodes of the diodes D1 and D2 are connected to each other. However, anodes of the diodes D1 and D2 may be connected to each other. For example, the diodes D1 and D2 correspond to a Zener diode.

The magnetic memory 100 includes a first wire 130a, a second wire 130b, and a third wire 130c. Further, the magnetic memory 100 includes a first external terminal 140a, a second external terminal 140b, and a third external terminal 140c. The first external terminal 140a is electrically connected to the first wire 130a. The first wire 130a is electrically connected to the fifth magnetic layer 11 and the second semiconductor layer 17. In the present embodiment, the first wire 130a is electrically connected to the fourth magnetic layer 10 in the fifth magnetic layer 11. The second external terminal 140b is electrically connected to the second wire 130b. The second wire 130b is electrically connected to the second electrode 4b. The third external terminal 140c is electrically connected to the third wire 130c. The third wire 130c is electrically connected to the third electrode 4c. The first external terminal 140a, the second external terminal 140b, and the third external terminal 140c are terminals connectable to an external circuit (not illustrated) present outside the magnetic memory 100. An example of the external circuit is a circuit including a controller that controls reading of information, writing of information, etc. with respect to the magnetic memory 100.

Hereinafter, a description will be given of an example of an operation of the magnetic memory 100.

Figure 3:
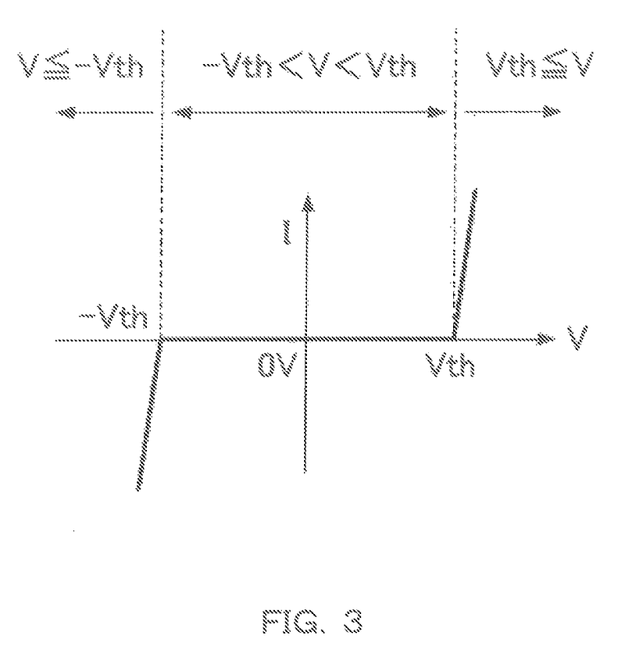
FIG. 3 is a schematic view illustrating a characteristic of a portion of the magnetic memory according to the first embodiment.

FIG. 3 is a schematic view illustrating a characteristic of a portion of the magnetic memory according to the first embodiment.

FIG. 3 illustrates a current-voltage characteristic of the circuit element 120.

As illustrated in FIG. 3, the circuit element 120 has a positive threshold value Vth and a negative threshold value −Vth. A voltage applied between the first wire 130a and the second wire 130b is set to an "inter-wire voltage V". When the inter-wire voltage V is in a range of "−Vth<V<Vth", and "V<|Vth|", a current I does not flow to the circuit element 120.

When the inter-wire voltage V is in a range of "Vth≤V", the current I flows from the first wire 130a to the second wire 130b in the circuit element 120. When the inter-wire voltage V is in a range of "V≤−Vth", the current I flows from the second wire 130b to the first wire 130a in the circuit element 120.

(Read Operation)

A read operation is performed by setting an inter-wire voltage Vr to "Vr<|Vth|". For example, a used external terminal corresponds to the first external terminal 140a and the second external terminal 140b. At the time of the read operation, a first potential difference is applied to the first external terminal 140a and the second external terminal 140b. The inter-wire voltage Vr is set to "Vr<|Vth|" based on the first potential difference.

Figure 4:
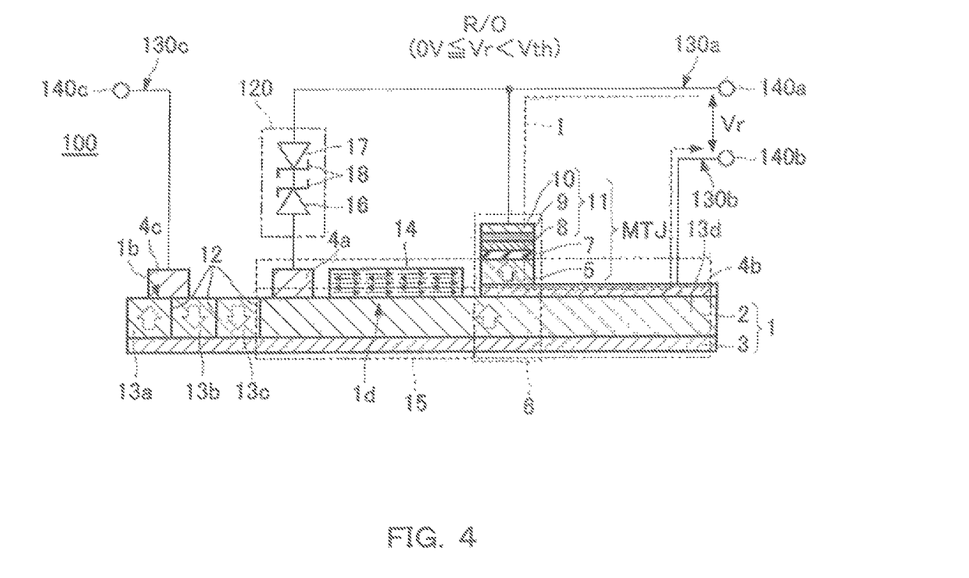
FIG. 4 is a schematic view to explain an operation of the magnetic memory according to the first embodiment.

FIG. 4 is a schematic view illustrating an operation of the magnetic memory 100 according to the first embodiment.

FIG. 4 illustrates a read operation R/O of the magnetic memory 100.

FIG. 4 illustrates a case in which a positive potential is applied to the first wire 130a, and a lower voltage than that applied to the first wire 130a, for example, a ground potential (0 V) is applied to the second wire 130b. The inter-wire voltage Vr is in a range of "0 V≤Vr≤Vth". In this case, a current I flows from the first wire 130a toward the second wire 130b through the read head 6. A value of the current I varies depending on the resistance value of the MTJ element of the read head 6. The value of the current I is large when the resistance value of the MTJ element is low, and the value of the current I is small when the resistance value of the MTJ element is high. Whether information recorded in, for example, the magnetic domain 13d of the magnetic recording layer (first magnetic layer 2) corresponds to "1" or "0" is determined based on a magnitude of the value of the current I.

The magnetic memory 100 may set a voltage drop of the MTJ element to be higher than the inter-wire voltage Vr. In this case, the current I does not flow. Whether information recorded in the magnetic domain 13d corresponds to "1" or "0" is determined based on whether the current I flows or not.

In an example of the read operation R/O illustrated in FIG. 4, a potential of the second wire 130b is set to be lower than that of the first wire 130a. However, the potential of the second wire 130b may be set to be higher than that of the first wire 130a. In this case, the current I flows from the second wire 130b toward the first wire 130a through the MTJ element. Specifically, a positive current is applied to the second wire 130b, and 0 V is applied to the first wire 130a. Alternatively, 0 V is applied to the second wire 130b, and a negative potential is applied to the first wire 130a. In this case, whether information corresponds to "1" or "0" is determined based on a magnitude of the value of the current I or whether the current I flows or not.

(Write Operation)

A write operation is performed by setting an inter-wire voltage Vw to "Vth≤Vw" or "−Vw≤−Vth" depending on written information. For example, a used external terminal corresponds to the first external terminal 140a and the second external terminal 140b. At the time of the write operation, a second potential difference is applied to the first external terminal 140a and the second external terminal 140b. The inter-wire voltage Vw is set to "Vth≤Vw" or "−Vw≤−Vth" based on the second potential difference.

Figure 5:
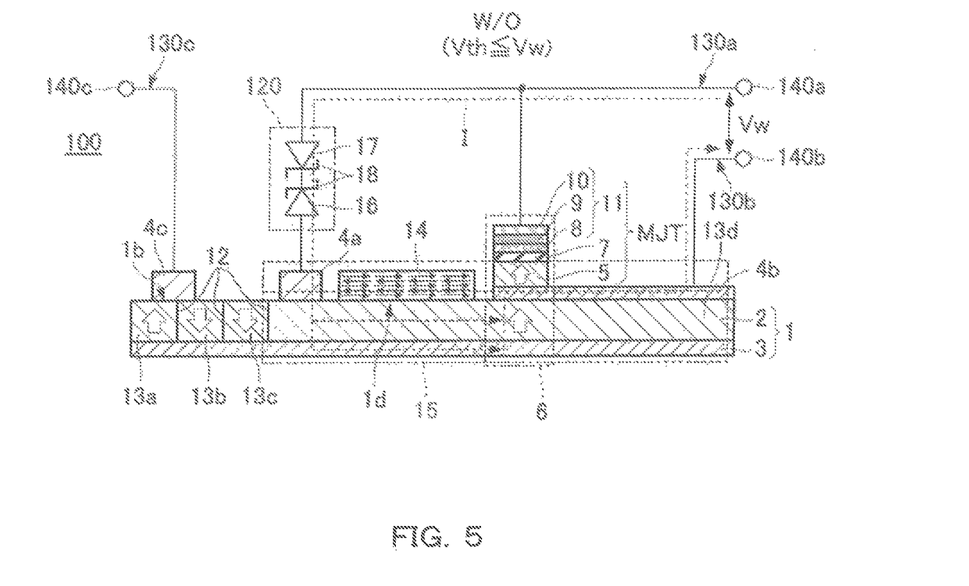
FIG. 5 is a schematic view to explain an operation of the magnetic memory according to the first embodiment.

FIG. 5 is a schematic view to explain an operation of the magnetic memory according to the first embodiment.

FIG. 5 illustrates a write operation W/O of the magnetic memory 100.

FIG. 5 illustrates a case in which the inter-wire voltage Vw is set to "Vth≤Vw".

For example, a state illustrated in FIG. 5 is obtained by applying a positive potential greater than or equal to the positive threshold value Vth to the first wire 130a, and applying a potential of a ground potential (0 V) to the second wire 130b. The current I flows from the first wire 130a toward the second wire 130b through the circuit element 120. In this instance, in the conductive layer 3, the current I flows from the first electrode 4a toward the second electrode 4b through at least the conductive layer 3. In this way, spin is injected into the first magnetic layer 2 from the conductive layer 3. In this way, for example, a magnetization direction of the magnetic domain 13a of the first magnetic layer 2 corresponds to the "upward direction." Information, a magnetization direction of which corresponds to the "upward direction" is written to the magnetic domain 13a.

When information, a magnetization direction of which corresponds to the "downward direction" is desired to be written to the magnetic domain 13a, the inter-wire voltage Vw may be set to "−Vth≤−Vw". For example, the ground potential (0 V) may be applied to the first wire 130a, and a positive potential greater than or equal to the positive threshold value Vth may be applied to the second wire 130b in order to set the inter-wire voltage Vw to "−Vth≤−Vw". Alternatively, a negative potential leas than or equal to the negative threshold value −Vth may be applied to the first wire 130a, and the ground potential (0 V) may be applied to the second wire 130b. The current I flows from the second wire 130b toward the first wire 130a through the circuit element 120 and through at least the conductive layer 3. In this instance, the current I flows from the second electrode 4b toward the first electrode 4a in the conductive layer 3. Reverse spin of the state illustrated in FIG. 5 is injected into the first magnetic layer 2 from the conductive layer 3. In this way, for example, the magnetization direction of the magnetic domain 13a of the first magnetic layer 2 corresponds to the "downward direction." Information, a magnetization direction of which corresponds to the "downward direction," is written to the magnetic domain 13a.

(Shift Operation)

A shift operation is performed by setting an inter-wire voltage Vsf to "Vw<Vsf" or "−Vsf<−Vw" depending on a shift direction. The inter-wire voltage Vsf is a voltage between the second wire 130b and the third wire 130c. For example, a used external terminal corresponds to the second external terminal 140b and the third external terminal 140c. At the time of the shift operation, a third potential difference is applied to the second external terminal 140b and the third external terminal 140c. The inter-wire voltage Vsf is set to "Vw<Vsf" or "−Vsf<−Vw" baaed on the third potential difference.

Figure 6:
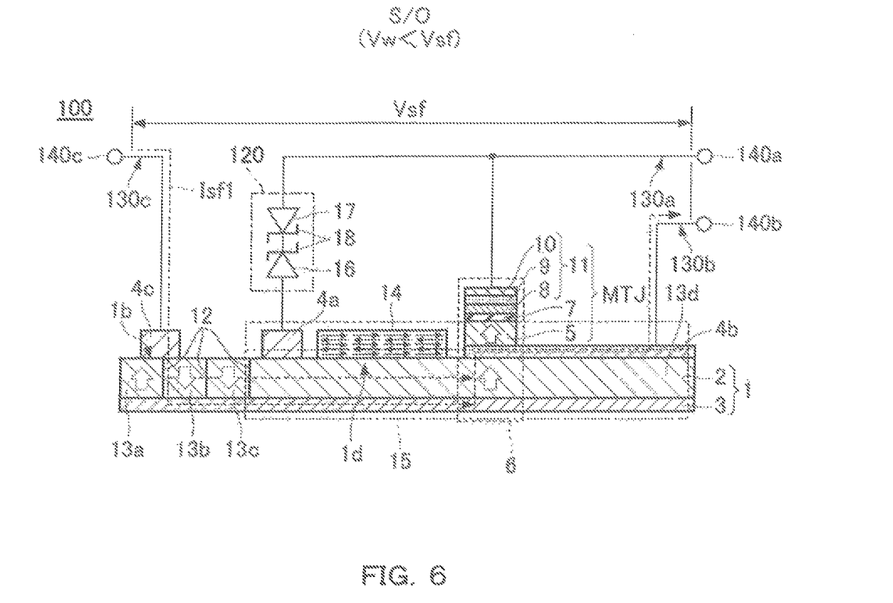
FIG. 6 is a schematic view to explain an operation of the magnetic memory according to the first embodiment.

FIG. 6 is a schematic view to explain an operation of the magnetic memory according to the first embodiment.

FIG. 6 illustrates a shift operation S/O of the magnetic memory 100.

FIG. 6 illustrates a case in which the inter-wire voltage Vsf is set to "Vw<Vsf".

The inequality "Vw<Vsf" corresponds to a case in which a potential of the third wire 130c is set to be higher than that of the second wire 130b. The inequality "−Vsf<−Vw" corresponds to a case in which a potential of the third wire 130c is set to be lower than that of the second wire 130b. In the shift operation S/O, for example, the potential of the second wire 130b is fixed to a ground potential (for example, 0 V), and the potential of the third wire 130c is set to a positive potential or a negative potential depending on a direction in which information is shifted. Alternatively, the potential of the second wire 130b and the potential of the third wire 130c are modified depending on the direction in which information is shifted.

At the time of "Vw<Vsf", a first shift current Isf1 flows from the third electrode 4c toward the second electrode 4b through the first magnetic layer 2 and the conductive layer 3 (see FIG. 6). When the first shift current Isf1 flows to the first magnetic layer 2 by penetrating the magnetic domain wall 12, the magnetic domain wall 12 is shifted from the third electrode 4c side to the second electrode 4b side. The magnetic domains 13a to 13d are shifted from the third electrode 4c toward the second electrode 4b.

At the time of "−Vsf<−Vw", a second shift current Isf2 corresponding to a reverse current flows from the second electrode 4b toward the third electrode 4c through the first magnetic layer 2 and the conductive layer 3 (the second shift current Isf2 is not particularly illustrated). When the second shift current Isf2 flows to the first magnetic layer 2 through the magnetic domain wall 12, the magnetic domain wall 12 is shifted from the second electrode 4b side to the third electrode 4c side. The magnetic domains 13a to 13d are shifted from the second electrode 4b toward the third electrode 4c.

For example, inter-wire voltages Vsf and −Vsf are applied with pulse forms. While the inter-wire voltage Vsf or −Vsf is applied with pulse forms, the first shift current Isf1 or the second shift current Isf2 flows. The magnetic domain wall 12 moves while the first shift current Isf1 and the second shift current Isf2 flow. For example, a distance in which the magnetic domain wall 12 moves in one pulse is a distance corresponding to one of the magnetic domains 13a to 13d. However, the distance in which the magnetic domain wall 12 moves in one pulse is not restricted thereto.

FIG. 6 illustrates a case in which the magnetic domain 13c is present in the read head 6. When the magnetic domain 13b is desired to be shifted from the magnetic domain 13c to the read head 6, for example, one pulse of the inter-wire voltage Vsf is applied. In this way, the magnetic domain 13b is shifted to the read head 6. When the magnetic domain 13d is desired to be shifted from the magnetic domain 13c to the read head 6, for example, one pulse of the inter-wire voltage −Vsf is applied. In this way, the magnetic domain 13d is shifted to the read head 6. Such an operation is performed when the magnetic domains 13a to 13d are shifted to the write head 15.

In the shirt operation S/O, a magnetic domain, in which information desired to be read is recorded, among the magnetic domains 13a to 13d is shifted to the read head 6.

In addition, a magnetic domain, to which information is desired to be written, among the magnetic domains 13a to 13d is shifted to the write head 15.

During the shift operation S/O, the first shift current Isf1 and the second shift current Isf2 flow to the conductive layer 3 in addition to the first magnetic layer 2. Similarly to the write operation W/O, the current flows to the conductive layer 3. A difference is that the magnetic domain wall 12 moves or stops in the first magnetic layer 2. When the magnetic domain wall 12 moves, injection of spin into the first magnetic layer 2 is suppressed even when a current flows to the conductive layer 3.

In other words, during the write operation W/O, the magnetic domain wall 12 is stopped. In this way, injection of spin into the first magnetic layer 2 is promoted. During the shift operation S/O, the magnetic domain wall 12 is moved. In this way, injection of spin into the first magnetic layer 2 is suppressed. Whether the magnetic domain wall 12 continues to be stopped or is moved may be controlled by a magnitude of the current flowing to the first magnetic layer 2.

According to the magnetic memory 100 related to the first embodiment, a magnetic domain wall movement memory in which an information writing scheme is set to a spin injection scheme (hereinafter referred to as a spin injection magnetic domain wall movement memory) is provided.

According to the magnetic memory 100 related to the first embodiment, the read operation R/O is performed based on the first potential difference applied to the first external terminal 140a and the second external terminal 140b. The write operation W/O is performed based on the second potential difference applied to the first external terminal 140a and the second external terminal 140b. For this reason, the external terminals to be used may not be difference between the read operation R/O and the write operation W/O. Therefore, the magnetic memory 100 related to the first embodiment may reduce the number of the external terminals when compared to a magnetic memory that uses different external terminals between the read operation R/O and the write operation W/O.

The sixth magnetic layer 14 is provided in the fourth portion 1d between the first portion 1a of the structure 1 and the second portion 1b of the structure 1. For this reason, for example, the magnetic memory 100 may record information in each of the plurality of the magnetic domains in the first magnetic layer 2 between the first portion 1a and the second portion 1b of the structure 1.

The third electrode 4c is electrically connected to the second portion 1b of the structure 1. For this reason, the first magnetic layer 2 of the structure 1 may be used as a magnetic recording layer of the magnetic domain wall movement memory in which a plurality of information items is recorded.

Further, a potential is applied to the first wire 130a not only when the read operation R/O is performed, but also when the write operation W/O is performed. For this reason, in a memory cell array in which the magnetic recording layer (first magnetic layer 2), the read head 6, and the write head 15 are integrated, a wire for the read operation R/O and a wire for the write operation W/O may not be separately provided. Therefore, the magnetic memory 100 may improve a degree of integration of the memory cell array when compared to a magnetic memory including a wire for the read operation R/O and a wire for the write operation W/O inside a memory cell array.

A higher TMR ratio is required for the MTJ element of the read head 6. In this way, a design/manufacturing margin of the magnetic memory 100 is enlarged. A difference in resistance value is enlarged between a high resistance state and a low resistance state in order to obtain a high TMR ratio. However, when a resistance value in the high resistance state is excessively increased, a current has difficulty in flowing to the MTJ element during the write operation W/O, and a writing characteristic of the MTJ element is degraded.

In response to such circumstances, the magnetic memory 100 does not allow a current to flow to the MTJ element during the write operation W/O. For this reason, it is possible to increase the resistance value in the high resistance state without degrading the writing characteristic when compared to a case in which a current is allowed to flow to the MTJ element during the write operation W/O. Therefore, the magnetic memory 100 may enlarge a design/manufacturing margin thereof.

The magnetic memory 100 may write information when the inter-wire voltage Vw is greater than or equal to the positive threshold value Vth or greater than or equal to the negative threshold value −Vth of the circuit element 120 irrespective of a resistance value of the MTJ element. For this reason, the resistance value of the MTJ element may be increased to a value at which electricity is not conducted at the inter-wire voltage Vw applied during the write operation.

In the magnetic memory 100, the first magnetic layer (magnetic recording layer) 2 is magnetostatically coupled to the second magnetic layer (free layer) 5. Information recorded in the magnetic domains 13a to 13d of the first magnetic layer 2 is delivered to the second magnetic layer 5 by magnetostatic coupling in the read head 6. When a magnetization direction is delivered from the first magnetic layer (magnetic recording layer) 2 to the second magnetic layer (free layer) 5 by magnetostatic coupling, the fifth magnetic layer (reference layer) 11 is preferably set to a synthetic anti-ferromagnetic (Sy-AF) structure. The Sy-AF structure may strongly fix the magnetization direction. For this reason, it is possible to suppress inversion of magnetization of the fifth magnetic layer (reference layer) 11 due to magnetostatic coupling. When the fifth magnetic layer (reference layer) 11 of the magnetic memory 100 is set to the Sy-AF structure, the design/manufacturing margin of the magnetic memory 100 is further enlarged.

As described above, according to the magnetic memory 100 related to the first embodiment, it is possible to provide a magnetic memory capable of reducing the number of external terminals, improving a degree of integration, and enlarging a design/manufacturing margin.

Second Embodiment

A second embodiment relates to an example of a case in which the magnetic memory 100 according to the first embodiment is integrated into a memory cell array.

Figure 7:
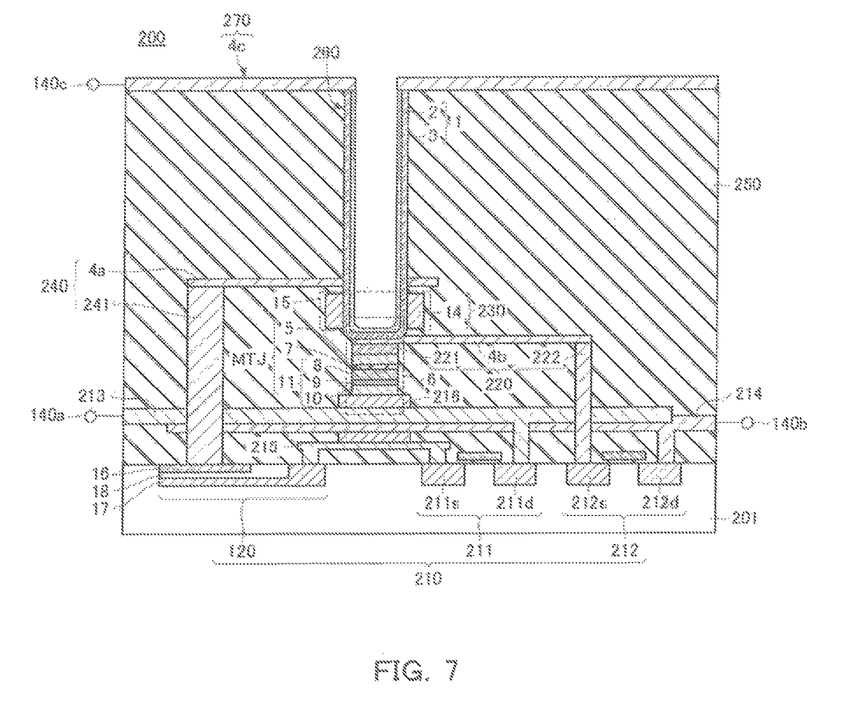
FIG. 7 is a schematic cross-sectional view illustrating a magnetic memory according to a second embodiment.

FIG. 7 is a schematic cross-sectional view illustrating a magnetic memory.

As illustrated in FIG. 7, the magnetic memory 200 according to the second embodiment includes a semiconductor structure 210, a magnetic tunnel junction structure MTJ, a first electrode structure 220, a bias structure 230, a second electrode structure 240, an insulating film 250, a memory hole 260, a structure 1, and a third electrode structure 270.

The semiconductor structure 210 is provided on a semiconductor substrate 201. The semiconductor structure 210 includes a first transistor 211, a second transistor 212, and a circuit element 120. The first transistor 211, the second transistor 212, and the circuit element 120 are provided on the semiconductor substrate 201. For example, the semiconductor substrate 201 corresponds to a p-type semiconductor. The first transistor 211 and the second transistor 212 provided in the p-type semiconductor substrate 201 corresponds to an n-channel type insulated gate FET. An example of the semiconductor substrate 201 is a silicon substrate.

One end of a current path of the first transistor 211, for example, an n-type drain region 211d is electrically connected to a first external terminal 140a through a first horizontal wire 213. One end of a current path of the second transistor 212, for example, an n-type drain region 212d is electrically connected to a second external terminal 140b through a second horizontal wire 214.

The circuit element 120 includes a first semiconductor layer 16 having a first conductivity type, a second semiconductor layer 17 having the first conductivity type, and a third semiconductor layer 18 having a second conductivity type. In the present embodiment, the first conductivity type corresponds to an n-type conductivity, and the second conductivity type corresponds to a p-type conductivity. The n-type conductivity and the p-type conductivity may be reversed. The n-type second semiconductor layer 17 is provided inside the p-type semiconductor substrate 201, and is electrically connected to the other end of the first transistor 211, for example, an n-type source region 211s through, for example, a third horizontal wire 215. A first vertical wire 216 is provided on the first horizontal wire 213. For example, the p-type third semiconductor layer 18 is provided inside the n-type second semiconductor layer 17, and is electrically connected to the n-type second semiconductor layer 17 through p-n junction. For example, the n-type first semiconductor layer 16 is provided inside the p-type third semiconductor layer 18, and is electrically connected to the p-type third semiconductor layer 18 through p-n junction.

In an example illustrated in FIG. 7, a first wire 130a includes the first horizontal wire 213, the current path of the first transistor 211, and the third horizontal wire 215. A second wire 130b includes the second horizontal wire 214 and the current path of the second transistor 212.

The magnetic tunnel junction structure MTJ is provided above the semiconductor structure 210. The magnetic tunnel junction structure MTJ includes a second magnetic layer 5, an insulating layer 7, and a fifth magnetic layer 11. The fifth magnetic layer 11 includes a third magnetic layer 8, a coupling layer 9, and a fourth magnetic layer 10. The fifth magnetic layer 11 has an Sy-AF structure. The fourth magnetic layer 10 included in the fifth magnetic layer 11 is provided on the first vertical wire 216. The fourth magnetic layer 10 is electrically connected to the n-type source region 211s and the second semiconductor layer 17 through the first vertical wire 216 and the third horizontal wire 215. The coupling layer 9 is provided on the fourth magnetic layer 10. The third magnetic layer 8 is provided on the coupling layer 9. The insulating layer 7 is provided on the third magnetic layer 8. The second magnetic layer 5 is provided on the insulating layer 7 (intermediate layer).

The first electrode structure 220 is provided above the magnetic tunnel junction structure MTJ. The first electrode structure 220 is electrically connected to the other end of the current path of the second transistor 212, for example, the n-type source region 212s and the second magnetic layer 5. In the present embodiment, the first electrode structure 220 includes a second electrode 4b, a connection electrode 221, and a second vertical wire 222. The second electrode 4b is electrically connected to the connection electrode 221 and the second vertical wire 222. The connection electrode 221 is provided on the second magnetic layer 5 to electrically connect the second electrode 4b to the second magnetic layer 5. The second vertical wire 222 is provided on the source region 212s to connect the second electrode 4b to the source region 212s.

The bias structure 230 is provided above the first electrode structure 220. The bias structure 230 includes a sixth magnetic layer 14. A write head 15 includes the bias structure 230.

The second electrode structure 240 is provided above the bias structure 230. The second electrode structure 240 is electrically connected to the first semiconductor layer 16. In the present embodiment, the second electrode structure 240 includes a first electrode 4a and a third vertical wire 241. The first electrode 4a is electrically connected to the third vertical wire 241. The third vertical wire 241 is provided on the first semiconductor layer 16 to electrically connect the first electrode 4a to the first semiconductor layer 16.

The insulating film 250 is provided above the second electrode structure 240. The insulating film 250 is an inter-layer insulating film that electrically insulates a structure included in the magnetic memory 200. In FIG. 7, the inter-layer insulating film is simplified and illustrated.

The memory hole 260 is provided in the insulating film 250. The first electrode structure 220 is exposed at a bottom portion of the memory hole 260. The second electrode structure 240 is exposed at a side portion of the memory hole 260.

The structure 1 is provided inside the memory hole 260. The structure 1 includes a first magnetic layer 2 and a conductive layer 3. In the present embodiment, the first magnetic layer 2 is provided on an inner wall including the bottom portion and the side portion of the memory hole 260. The first magnetic layer 2 is electrically connected to the first electrode structure 220 at the bottom portion of the memory hole 260. In the present embodiment, the first magnetic layer 2 is electrically connected to the second electrode 4b. The first magnetic layer 2 is electrically connected to the second electrode structure 240 at the side portion of the memory hole 260. In the present embodiment, the first magnetic layer 2 is electrically connected to the first electrode 4a. The conductive layer 3 is provided on the first magnetic layer 2. The read head 6 includes the first magnetic layer 2, the second electrode 4b, the connection electrode 221, the second magnetic layer 5, the insulating layer 7, and the fifth magnetic layer at the bottom portion of the memory hole 260. The first magnetic layer 2 is magnetostatically coupled to the second magnetic layer 5 at the bottom portion of the memory hole 260.

The third electrode structure 270 is provided on the insulating film 250. The third electrode structure 270 is electrically connected to the structure 1. The third electrode structure 270 includes a third electrode 4c. For example, the third electrode 4c is electrically connected to an upper end of the memory hole 260. The third electrode 4c is electrically connected to a third external terminal 140c.

Next, a description will be given of an example of an operation of the magnetic memory 200.

The operation of the magnetic memory 200 is similar to the operation of the magnetic memory 100 illustrated in FIG. 1. Therefore, hereinafter, a description will be given of a current path at the time of the read operation, at the time of the write operation, and at the time of the shift operation.

(Read Operation)

Figure 8:
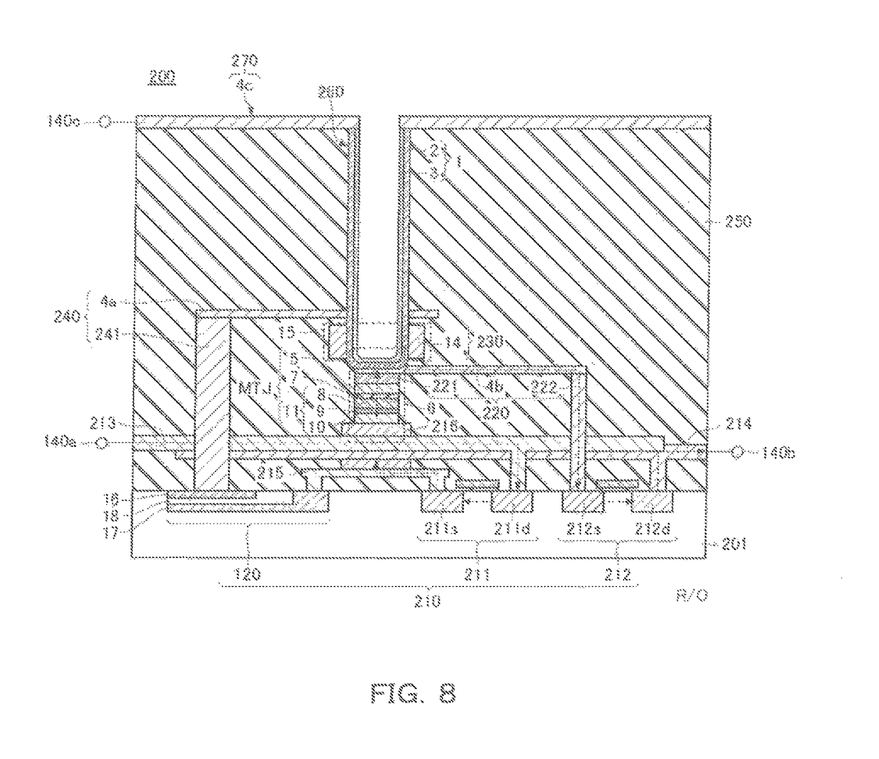
FIG. 8 is a schematic view to explain an operation of the magnetic memory according to the second embodiment.

FIG. 8 is a schematic view illustrating the operation of the magnetic memory 200 according to the second embodiment.

FIG. 8 illustrates the read operation R/O.

As illustrated in FIG. 8, at the time of the read operation R/O, for example, a current path corresponds to the first external terminal 140a—the first horizontal wire 213—the drain region 211d—the source region 211s—the read head 6—the wire 215—the first vertical wire 216—the read head 6—the second electrode 4b—the second vertical wire 222—the source region 212s—the drain region 212d—the second horizontal wire 214—the second external terminal 140b. In the read head 6, a current path from the MTJ to the connection electrode 221 is interposed.

(Write Operation)

Figure 9:
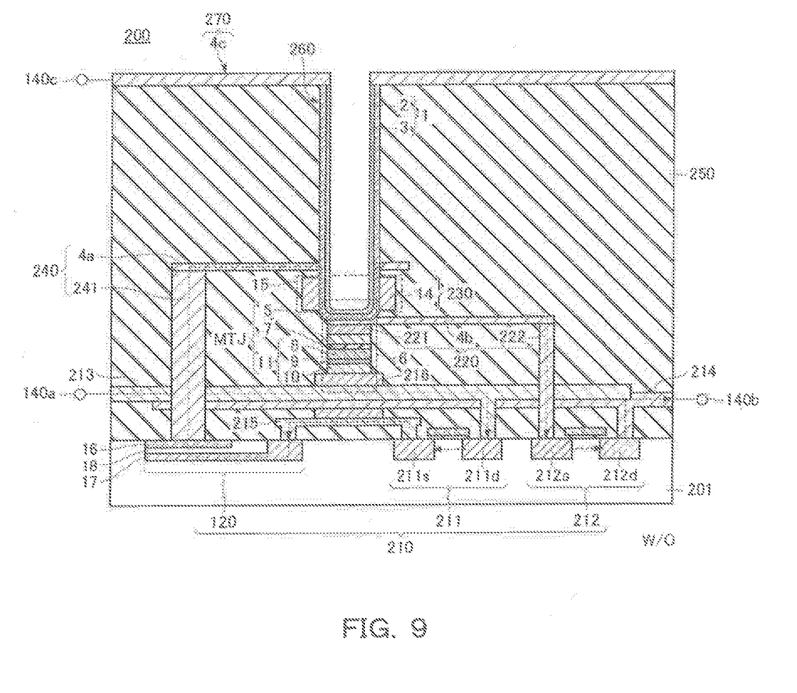
FIG. 9 is a schematic view to explain an operation of the magnetic memory according to the second embodiment.

FIG. 9 is a schematic view illustrating the operation of the magnetic memory 200 according to the second embodiment.

FIG. 9 illustrates the write operation W/O.

As illustrated in FIG. 9, at the time of the write operation W/O, for example, a current path corresponds to the first external terminal 140a—the first horizontal wire 213—the drain region 211d—the source region 211s—the third horizontal wire 215—the circuit element 120—the third vertical wire 241—the first electrode 4a—the conductive layer 3—the write head 15—the second electrode 4b—the second vertical wire 222—the source region 212s—the drain region 212d—the second horizontal wire 214—the second external terminal 140b. The current path may be reversed from that in a case illustrated in FIG. 10 depending on written information.

(Shift Operation)

Figure 10:
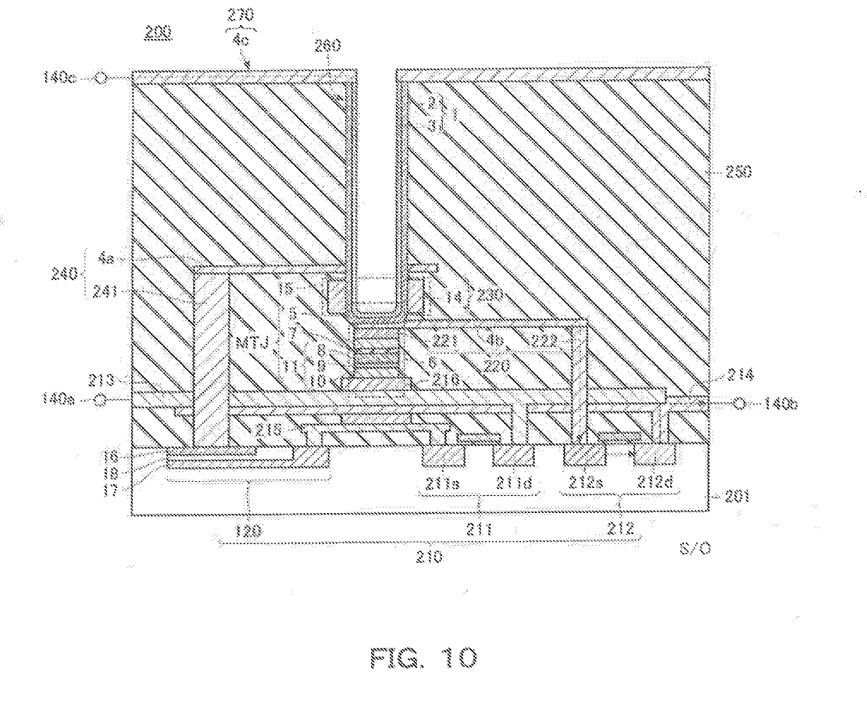
FIG. 10 is a schematic view to explain an operation of the magnetic memory according to the second embodiment.

FIG. 10 is a schematic view to explain the operation of the magnetic memory 200 according to the second embodiment.

FIG. 10 illustrates the shift operation S/O.

As illustrated in FIG. 10, at the time of the shift operation S/O, for example, a current path corresponds to the third external terminal 140c—the first magnetic layer 2—the second electrode 4b—the second vertical wire 222—the source region 212s—the drain region 212d—the second horizontal wire 214—the second external terminal 140b. The current path may be reversed from that in a case illustrated in FIG. 10 depending on a direction in which information is shifted.

Hereinbefore, the embodiments of the invention have been described with reference to specific examples. However, the embodiments of the invention are not restricted to these specific examples. For example, with regard to specific configurations of respective components included in the magnetic memory such as the first magnetic layer 2, the conductive layer 3, the second magnetic layer 5, the insulating layer 7, the sixth magnetic layer 14, etc., those skilled in the art may appropriately select the configurations from a known range. In addition, the configurations are included in the scope of the invention as long as the invention may be similarly implemented, and the same effect may be obtained.

In addition, a combination of two or more components of the respective specific examples in a technically allowed range is included in the scope of the invention as long as a subject matter of the invention is contained.

Additionally, all magnetic memory elements and nonvolatile storages that may be implemented when the those skilled in the art appropriately change a design based on the magnetic memory described above as the embodiments of the invention belong to the scope of the invention as long as the subject matter of the invention is contained.

Additionally, those skilled in the art may conceive various modifications and corrections in a category of the spirit of the invention, and it is understood that the modifications and corrections belong to the scope of the invention.

Some embodiments of the invention have been described. However, these embodiments are presented as examples and are not intended to restrict the scope of the invention. These new embodiments may be implemented in various other modes, and may be omitted, replaced, and changed in various manners within a range not departing from the subject matter of the invention. These embodiments or modifications thereof are included in the scope or the subject matter of the invention, and included in the scope of the invention described in claims, equivalents thereof, etc.

What is claimed is:

1. A magnetic memory comprising:
    a structure (1) including a first magnetic layer (2) and a conductive layer (3);
    a second magnetic layer (5), the first magnetic layer being disposed between the second magnetic layer and the conductive layer;
    a first electrode (4a) electrically connected to a first portion of the structure;
    a second electrode (4b) provided between the first magnetic layer and the second magnetic layer;
    a third magnetic layer (11) provided insulatingly from a third portion (1c) of the structure;
    a third electrode (4c) electrically connected to a second portion (1b) of the structure;
    a sixth magnetic layer (14) provided between the first electrode and the second electrode;
    a first semiconductor layer (16, anode) having a first conductivity type electrically connected to the first electrode;
    a second semiconductor layer (17, anode) having the first conductivity type electrically connected to the third magnetic layer; and
    a third semiconductor layer (18, cathode) having a second conductivity type electrically connected to the first semiconductor layer and the second semiconductor layer.

2. The magnetic memory according to claim 1, wherein the first electrode is connected to the second electrode by a parallel circuit including a first resistor portion based on the conductive layer and a second resistor portion based on the first magnetic layer, the second resistor portion connected in parallel to the first resistor portion.

3. The magnetic memory according to claim 2, wherein a resistance value of the first resistor portion is lower than a resistance value of the second resistor portion.

4. The magnetic memory according to claim 1, wherein the conductive layer is non-magnetic.

5. The magnetic memory according to claim 1, wherein the first magnetic layer is magnetostatically coupled to the second magnetic layer.

6. The magnetic memory according to claim 1,
    wherein the third magnetic layer (11) includes:
    a fifth magnetic layer (8);
    a sixth magnetic layer (10); and
    a non-magnetic layer (9) provided between the fifth magnetic layer and the sixth magnetic layer, and
    a magnetization direction of the fifth magnetic layer is opposite to a magnetization direction of the sixth magnetic layer.

7. The magnetic memory according to claim 1, further comprising:
    a first wire (130a) electrically connected to the third magnetic layer and the second semiconductor layer;
    a second wire (130b) electrically connected to the second electrode; and
    a third wire (130c) electrically connected to the third electrode.

8. The magnetic memory according to claim 7, further comprising
a circuit element (120) including:
the first semiconductor layer having the first conductivity type electrically connected to the first electrode;
the second semiconductor layer having the first conductivity type electrically connected to the third magnetic layer; and
the third semiconductor layer having the second conductivity type electrically connected to the first semiconductor layer and the second semiconductor layer,
wherein the circuit element has a positive threshold voltage Vth and a negative threshold voltage −Vth,
a voltage Vr between the first wire and the second wire is in a range of Vr<|Vth| during a read operation,
a voltage Vw between the first wire and the second wire is in a range of Vth≤Vw or −Vw≤−Vth during a write operation, and a voltage Vsf between the second wire and the third wire is in a range of Vw≤Vsf or −Vsf≤−Vw during a shift operation.

9. The magnetic memory according to claim 8, further comprising:
a first external terminal (140a);
a second external terminal (140b); and
a third external terminal (140C),
wherein the first external terminal is electrically connected to the first wire,
the second external terminal is electrically connected to the second wire,
the third external terminal is electrically connected to the third wire,
a first potential difference is applied to the first external terminal and the second external terminal during the read operation,
a second potential difference is applied to the first external terminal and the second external terminal during the write operation, and
a third potential difference is applied to the second external terminal and the third external terminal during the shift operation.

10. The magnetic memory according to claim 9, wherein first information and second information are written to the first magnetic layer.

11. The magnetic memory according to claim 10,
wherein the first magnetic layer includes a first magnetic domain and a second magnetic domain, and
the first information is written to the first magnetic domain, and the second information is written to the second magnetic domain.

12. The magnetic memory according to claim 1, wherein the sixth magnetic layer has antiferromagnetism.

13. A magnetic memory comprising:
a memory portion (1) including a conductive layer (3) and a first magnetic layer (2), in which data is written to or read out from;
MTJ element (5, 7, 11) provided above a first part (1c) of the memory portion, the MTJ element having a second magnetic layer (5), a reference magnetic layer (11) provided on the second magnetic layer via an insulating layer;
a first electrode (4a) provided on a second part (1a) of the memory portion;
a diode pair (120) being series coupled, one end of the diode pair connected to the first electrode;
a second magnetic layer (14) provided between the first electrode and the second electrode and provided on a third part (1d) of the memory portion;
a second electrode (4b) provided between the memory portion and the MTJ and on the memory portion;
a third electrode (4c) provided on a fourth part (1b) of the memory portion;
a first terminal (140a) connected to the MTJ element and another end of the diode pair;
a second terminal (140b) connected to the second electrode; and
a third terminal (140c) connected to the third electrode.

14. The magnetic memory according to claim 13, wherein the third magnetic layer 14 come into contact with the conductive layer of the memory portion or come into contact with the first magnetic layer 2.

15. The magnetic memory according to claim 14, wherein the third magnetic layer has a fixed magnetization direction along a surface of the memory portion and applies an exchange bias to the first magnetic layer.

16. The magnetic memory according to claim 13, wherein the conductive layer is non-magnetic material whose spin-orbit interaction is large.

17. The magnetic memory according to claim 16, wherein the conductive material may include tantalum (Ta) and platinum (Pt).

18. The magnetic memory according to claim 13, wherein the third magnetic layer 14 is antiferromagnetic or ferromagnetic.

19. The magnetic memory according to claim 13, wherein reading information from the memory portion is performed by applying a first potential between the first terminal and the second terminal, writing information to the memory portion is performed by applying a second potential to the first terminal and the second terminal, and shift operation to shift information in the memory portion to a certain direction by applying a third potential between the first terminal and the third terminal,
wherein the first potential and the second potential being set according to a value of threshold voltages of the pair of diode pair are applied.

20. The magnetic memory according to claim 13, wherein the magnetic memory is a spin injection magnetic domain wall movement memory.

* * * * *